United States Patent
Fujiyoshi

(10) Patent No.: US 6,304,105 B1
(45) Date of Patent: Oct. 16, 2001

(54) LEVEL SHIFTER CIRCUIT

(75) Inventor: Yoshinori Fujiyoshi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/563,228

(22) Filed: May 2, 2000

(30) Foreign Application Priority Data

Jul. 27, 1999 (JP) ................................. 11-211741

(51) Int. Cl.[7] .................................................. H03K 17/10
(52) U.S. Cl. ................................ 326/81; 326/68; 326/80
(58) Field of Search .............................. 326/68, 80, 81, 326/82, 83, 86

(56) References Cited

U.S. PATENT DOCUMENTS

| | | | |
|---|---|---|---|
| 5,352,942 | * 10/1994 | Tanaka et al. | 307/475 |
| 5,378,943 | * 1/1995 | Dennard | 326/68 |
| 5,798,657 | * 8/1998 | Nebel et al. | 326/81 |
| 5,914,617 | * 6/1999 | Bartlett | 326/81 |

FOREIGN PATENT DOCUMENTS 07193488   7/1995   (JP).

* cited by examiner

*Primary Examiner*—Michael Tokar
*Assistant Examiner*—Anh Q. Tran

(57) ABSTRACT

The level shifter circuit includes a low-voltage operating inverter INV4, a high-voltage operating inverter INV5, NMOS transistors NT5 and NT6 and a PMOS transistor PT3. The output from low-voltage operating inverter INV4, the source of NMOS transistor NT6 and the gate of PMOS transistor PT3 are joined. The input to high-voltage operating inverter INV5, the drain of NMOS transistor NT6 and the source of NMOS transistor PT5 and that of PMOS transistor PT3 are joined. The drain of NMOS transistor NT5 and the gates of NMOS transistors NT5 and NT6 are connected to the power feed line of a high-voltage power source. The input to low-voltage operating inverter INV4 forms an input signal terminal Vin2 while the output from high-voltage operating inverter INV5 forms an output signal terminal Vout2.

3 Claims, 2 Drawing Sheets

LEVEL SHIFTER CIRCUIT

BACKGROUND OF THE INVENTION (1). Field of the Invention

The present invention relates to a level shifter circuit for use in a semiconductor integrated circuit device in which circuits are operated by different voltages, in particular relates to a level shifter circuit which shifts the level of the signal output from a low-voltage operating circuit and outputs a level-shifted signal to a high-voltage operating circuit.

(2). Description of the Prior Art

FIG. 1 is a circuit diagrams showing a configurational example of a conventional level shifter circuit (c.f. Japanese Patent Application Laid-Open Hei 7 No. 193488).

This level shifter circuit includes low-voltage operating inverters INV1 and INV2, a high-voltage operating inverter INV3, N-channel MOS (to be abbreviated as NMOS hereinbelow) transistors NT1, NT2, NT3 and NT4 and P-channel MOS (to be abbreviated as PMOS hereinbelow) transistors PT1 and PT2. The output from low-voltage operating inverter INV1, the input to low-voltage operating inverter INV2, the gates of NMOS transistors NT1 and NT3 are joined. The output from low-voltage operating inverter INV2 is connected to the gates of NMOS transistors and NT2 and NT4. The input to high-voltage operating inverter INV3, the drains of NMOS transistors NT2 and PMOS transistors PT2, the gate of PMOS transistor PT1 and the source of NMOS transistor PT3 are joined. The drains of NMOS transistor NT1 and PMOS transistor PT1 and the gate of PMOS transistor PT2 and the source of NMOS transistor NT4 are joined. The sources of PMOS transistors PT1 and PT2 and the drains of NMOS transistors NT3 and NT4 are connected to the power feed line from a high-voltage power source. The input to low-voltage operating inverter INV1 forms an input signal terminal Vin1 while the output from high-voltage operating inverter INV3 forms an output signal terminal Vout1.

Next, the operation of the thus configured level shifter circuit will be described. When a signal which transits from a VSS level (to be referred to as 'the L-level' hereinbelow) to a VDD1 level (to be referred to as 'the H-level' hereinbelow) is supplied from a low-voltage operating circuit to input signal terminal Vin1, the output signal from low-voltage operating inverter INV1 transits from the H-level to the L-level. With this transition, the ON-state resistance of NMOS transistor NT1 and that of NT3 gradually increase, so the source-drain voltage of NMOS transistor NT1 and that of NT3 increase. At almost the same time, the output signal from low-voltage operating inverter INV2 transits from the L-level to the H-level so that NMOS transistors NT2 and NT4 become activated with their resistances gradually becoming lowered and hence the voltages of NMOS transistors NT2 and NT4 between source and drain become lowered. The activation of NMOS transistor NT4 raises the potential at the gate of PMOS transistor PT2 to a midway voltage so that the ON-state resistance rises. This causes NMOS transistor NT2 to lower the potential at a node n2. Simultaneously, the lowered potential at node n2 lowers the ON-state resistance of PMOS transistor PT1 while raising the potential at a node n1. When input signal terminal Vin1 from the low-voltage operating circuit definitely reaches the H-level, NMOS transistors NT1 and NT3 are turned off, NMOS transistors NT2 and NT4 are turned on, PMOS transistor PT1 is turned on, and PMOS transistor PT2 is turned off. Thereby the output signal terminal Vout1 to the high-voltage operating circuit becomes stabilized and set at a VDD2 level (to be referred as 'the HH level').

On the other hand, when a signal which transits from the L-level to the H-level is supplied from the low-voltage operating circuit to input signal terminal Vin1, the output signal from low-voltage operating inverter INV1 transits from the L-level to the H-level. With this transition, the ON-state resistance of NMOS transistor NT1 and that of NT3 gradually become lowered, so the source-drain voltage of NMOS transistor N1 and that of NT3 become lowered. At almost the same time, the output signal from low-voltage operating inverter INV2 transits from the H-level to the L-level so that NMOS transistors NT2 and NT4 become inactive with their resistances gradually increasing and hence the voltages of NMOS transistors NT2 and NT4 between source and drain increase. The activation of NMOS transistor NT3 raises the potential at the gate of PMOS transistor PT1 to a midway voltage so that the ON-state resistance rises. This causes NMOS transistor NT1 to lower the potential at a node n1. Simultaneously, the lowered potential at node n1 lowers the ON-state resistance of PMOS transistor PT2 while raising the potential at a node n2. When input signal terminal Vin1 from the low-voltage operating circuit definitely reaches the L-level, NMOS transistors NT1 and NT3 are turned on, NMOS transistors NT2 and NT4 are turned off, PMOS transistor PT1 is turned off, and PMOS transistor PT2 is turned on. Thereby the output signal terminal Vout1 to the high-voltage operating circuit becomes stabilized and set at the L-level.

The above conventional level shifter circuit, however, suffers from the following drawback. That is, in the conventional level shifter circuit, for example, when a signal changing from the L-level to the H-level is supplied from the low-voltage operating circuit to input signal terminal Vin1, the output signal from low-voltage operating inverter INV1 changes from the H-level to the L-level while the output signal from low-voltage operating inverter INV2 changes from the L-level to the H-level. Upon these transitions, the change of the output signal from low-voltage operating inverter INV2 lags behind the change of the output signal from low-voltage operating inverter INV1. Therefore, NMOS transistors NT1, NT2, NT3 and NT4 and PMOS transistors PT1 and PT2 are temporarily turned off, causing potential instability at nodes n1 and n2 and hence producing difficulties in operating the level shifter at high speeds. The same drawback occurs when a signal changing from the H-level to the L-level is supplied from the low-voltage operating circuit to input signal terminal Vin1.

SUMMARY OF THE INVENTION

It is therefore an object of the present invention to provide a level shifter circuit capable of solving the above drawback in the conventional level shifter circuit.

In order to achieve the above object, the present invention is configured as follows:

In accordance with the first aspect of the present invention, a level shifter circuit that receives the output signal from a low-voltage operating circuit and outputs a signal to a high-voltage operating circuit, includes:

- a first inverter receiving at the input terminal thereof a signal output from the low-voltage operating circuit and being operated by the low-voltage power source;
- a resistance divider circuit configured of a connected circuit of a plurality of MOS transistors, each having a predetermined ON-state resistance and including ON/OFF controllable MOS transistors in accordance with the output signal from the first inverter, the connected circuit being disposed between the high-voltage power source and the ground potential so as to produce an output signal of a predetermined level in accordance with the output signal from the first inverter; and a second inverter receiving the output signal from the resistance divider circuit at the input terminal thereof and being operating by the high-voltage power source.

In accordance with the second aspect of the present invention, the level shifter circuit having the above first feature is characterized in that the resistance divider circuit include: a first N-channel MOS transistor connected at the gate and drain thereof to the high-voltage power source; a second N-channel MOS transistor, connected at the gate thereof to the high-voltage power source, connected at the drain thereof to the source of the first N-channel MOS transistor, and connected at the source thereof to the output terminal from the first inverter; and a first P-channel MOS transistor, connected at the gate thereof to the output terminal from the first inverter, connected at the drain thereof to the ground potential, and connected at the source thereof to the joint between the source of the first N-channel MOS transistor and the drain of the second N-channel MOS transistor, and the joint between the source of the first N-channel MOS transistor and the drain of the second N-channel MOS transistor and the source of the first P-channel MOS transistor forms the output terminal.

In accordance with the third aspect of the present invention, the level shifter circuit having the above second feature is characterized in that the first, second N-channel MOS transistors and the first P-channel MOS transistor are configured so as to satisfy the following relationship:

$$L3/W3 \ll L1/W1 \ll L2/W2$$

where L1 and W1 are the channnel length and channel width of the first N-channel MOS transistor, L2 and W2 are the channel length and channel width of the second N-channel MOS transistor and L3 and W3 are the channel length and channel width of the first P-channel MOS transistor.

DESCRIPTION OF THE PREFERRED EMBODIMENTS

The present invention will hereinafter be described in detail based on one embodiment.

Figure 2:
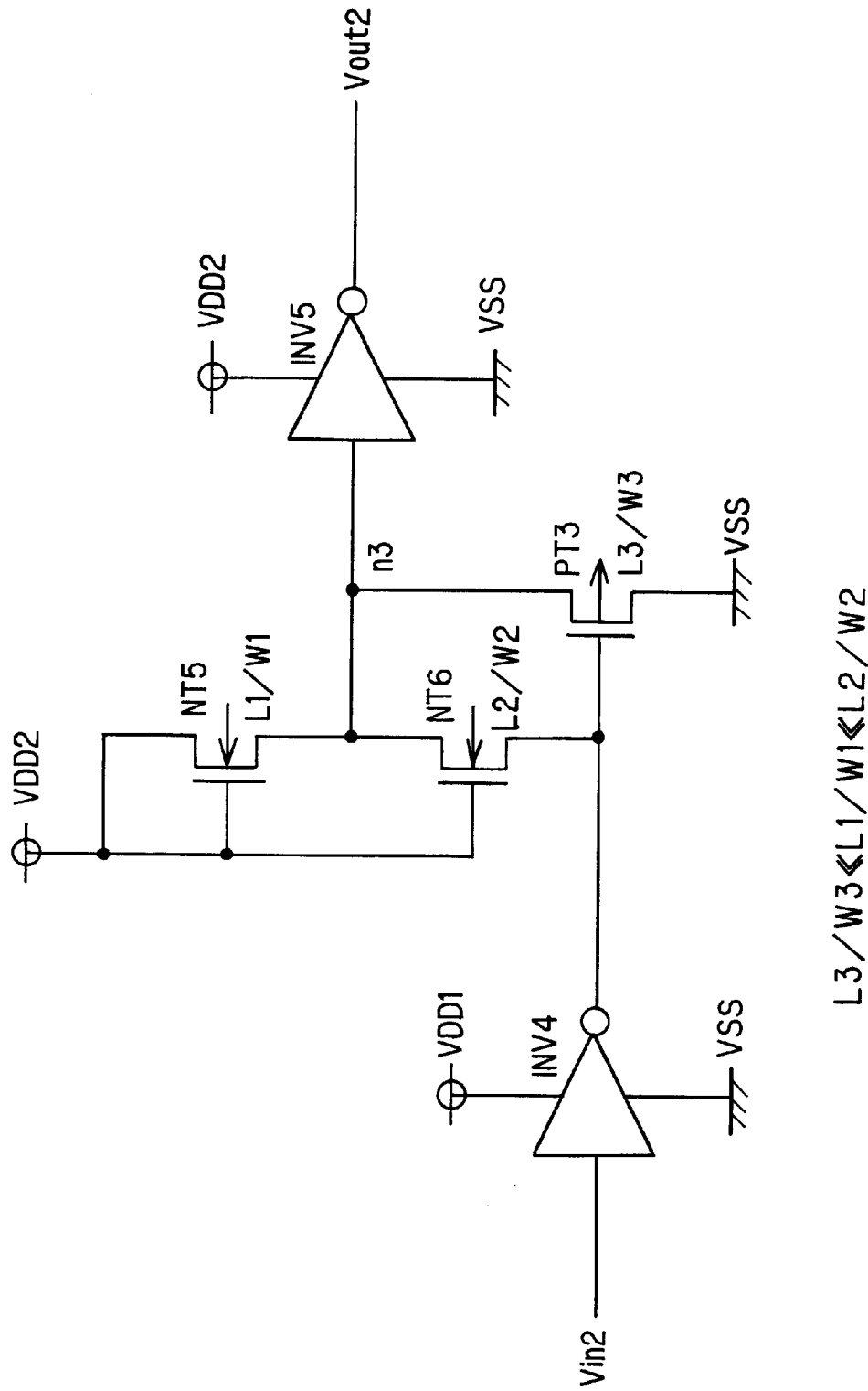
FIG. 2 is a circuit diagram showing a configuration of a level shifter circuit in accordance with one embodiment of the present invention.

FIG. 2 is a circuit diagram showing a configuration of a level shifter circuit in accordance with one embodiment of the present invention.

This level shifter circuit of this embodiment includes a low-voltage operating inverter INV4, a high-voltage operating inverter INV5, NMOS transistors NT5 and NT6 and a PMOS transistor PT3. The output from low-voltage operating inverter INV4, the source of NMOS transistor NT6 and the gate of PMOS transistor PT3 are joined. The input to high-voltage operating inverter INV5, the drain of NMOS transistor NT6 and the source of NMOS transistor PT5 and that of PMOS transistor PT3 are joined. The drain of NMOS transistor NT5 and the gates of NMOS transistors NT5 and NT6 are connected to the power feed line of a high-voltage power source. The input to low-voltage operating inverter INV4 forms an input signal terminal Vin2 while the output from high-voltage operating inverter INV5 forms an output signal terminal Vout2. In this circuit, the transistor dimensions of NMOS transistors NT5 and NT6 and PMOS transistor PT3 are determined so as to satisfy the following relationship:

$$L3/W3 \ll L1/W1 \ll L2/W2$$

where L1 and W1 are the channnel length and channel width of NMOS transistor NT5, L2 and W2 are the channel length and channel width of NMOS transistor NT6 and L3 and W3 are the channel length and channel width of PMOS transistor PT3.

Next, the operation of the thus configured level shifter circuit of this embodiment will be described. When a signal changing from the L-level to the H-level is supplied from a low-voltage operating circuit to input signal terminal Vin2, the output signal from low-voltage operating inverter INV4 transits from the H-level to the L-level. With this transition, the ON-state resistance of PMOS transistor PT3 gradually becomes lowered, so the voltage between source and drain of PMOS transistor PT3 lowers and hence the potential at a node n3 lowers. When input signal terminal Vin2 from the low-voltage operating circuit definitely reaches the H-level, the potential at node 3 becomes stabilized at a level determined by the ratio between the ON-resistance of NMOS transistor NT5 and the combined resistance of the ON-state resistance of NMOS transistor NT6, that of the ground-side NMOS transistor (not shown) in inverter INV4 and that of PMOS transistor PT3. Here, since the current path including NMOS transistor NT6 and PMOS transistor PT3 are in parallel and since L2/W2>>L3/W3, the combined resistance of the parallel circuit corresponds approximaltely to the ON-state resistance of PMOS transistor PT3. Since NMOS transistor NT5 and PMOS transistor PT3 are connected in series and since L1/W1>>L3/W3, the ON-state resistance of PMOS transistor PT3 is exteremly low compared to the ON-state resistance of NMOS transistor NT5. Resultantly, the potential at node n3 is arrorximately equal to the L-level. Therefore, the signal output from the output signal terminal Vout2 to a high-voltage operating circuit becomes stablized at the HH-level.

On the other hand, when a signal changing from the H-level to the L-level is supplied from a low-voltage operating circuit to input signal terminal Vin2, the output signal from low-voltage operating inverter INV4 transits from the L-level to the H-level. With this transition, the ON-state resistance of PMOS transistor PT3 gradually increases, so the voltage between source and drain of PMOS transistor PT3 increases and hence the potential at a node n3 increases. When input signal terminal Vin2 from the low-voltage operating circuit definitely reaches the L-level, PMOS transistor PT3 becomes turned off so that the potential at node 3 is set at a level determined by dividing the potential differece between voltage VDD2 from the high-voltage power source and voltage VDD1 from the low-voltage power source, approximately proportionally to the ON-state resistance of NMOS transistor NT5 and that of NMOS transistor NT6 (because the ON-state resistance of the power source-side PMOS transistor in low-voltage operating inverter INV4 is markedly smaller than the ON-state resistances of NMOS transistors NT5 and NT6). Here, since NMOS transistor NT5 and NMOS transistor NT6 are connected in series and since L2/W2>>L1/W1, the ON-resistance of NMOS transistor NT5 is extremely smaller than that of NMOS trnasistor NT6. Resultantly, the potential at node n3 is arrorximately equal to the H-level. Therefore, the signal output from the output signal terminal Vout2 to a high-voltage operating circuit becomes stablized at the L-level.

Figure 1:
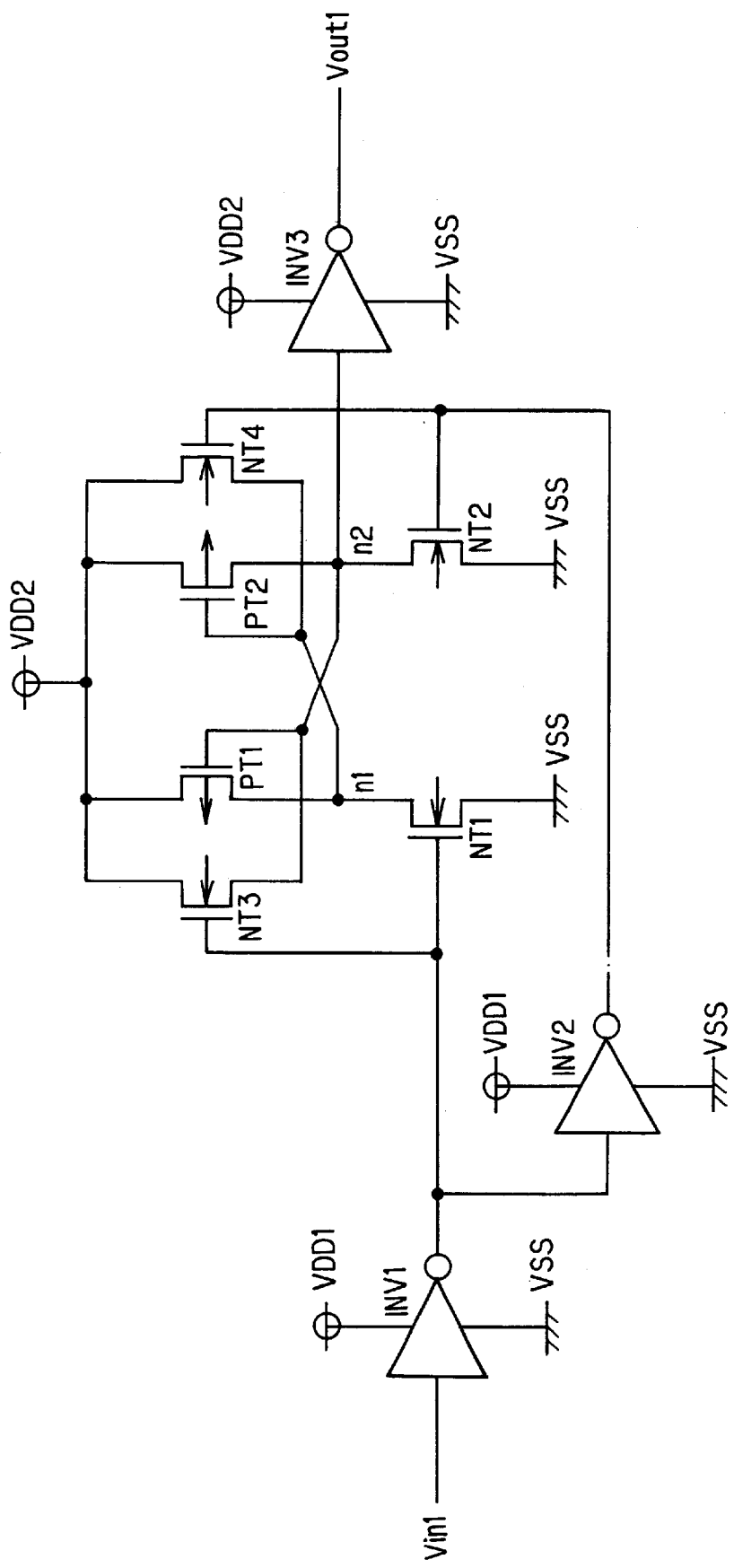
FIG. 1 is a circuit diagram showing a configuration of a conventional level shifter circuit.

As has been described, according to the level shifter circuit of the present embodiment, there exits no node at which the potential becomes unstable upon the level transition of the input signal. Therefore, it is possible to adjsut the transistor dimensions of the NMOS transistors and PMOS transistors, thus making it possible to readily realize a high-speed operation. Further, the level shifter circuit of this embodiment can be configured of a marked reduced number of elements compared to the above-described conventional level shifter. Specifically, the conventional level shifter circuit shown in FIG. 1 needs twelve MOS transistors, but the configuration of this embodiment only needs seven MOS transistors to form a level shifter.

As detailed heretofore, according to the present invention, it is possible to provide a markedly useful level shifter circuit which can readily realize a high speed operation with a lower number of elements.

What is claimed is:

1. A level shifter circuit that receives the output signal from a low-voltage operating circuit and outputs a signal to a high-voltage operating circuit, comprising:

a first inverter receiving at the input terminal thereof a signal output from the low-voltage operating circuit and being operated by the low-voltage power source;

a resistance divider circuit configured of a connected circuit of a plurality of MOS transistors, each having a predetermined ON-state resistance and including ON/OFF controllable MOS transistors in accordance with the output signal from the first inverter, the connected circuit being disposed between the high-voltage power source and the ground potential so as to produce an output signal of a predetermined level in accordance with the output signal from the first inverter; and a second inverter receiving the output signal from the resistance divider circuit at the input terminal thereof and being operating by the high-voltage power source.

2. The level shifter circuit according to claim 1, wherein the resistance divider circuit include: a first N-channel MOS transistor connected at the gate and drain thereof to the high-voltage power source; a second N-channel MOS transistor, connected at the gate thereof to the high-voltage power source, connected at the drain thereof to the source of the first N-channel MOS transistor, and connected at the source thereof to the output terminal from the first inverter; and a first P-channel MOS transistor, connected at the gate thereof to the output terminal from the first inverter, connected at the drain thereof to the ground potential, and connected at the source thereof to the joint between the source of the first N-channel MOS transistor and the drain of the second N-channel MOS transistor, and the joint between the source of the first N-channel MOS transistor and the drain of the second N-channel MOS transistor and the source of the first P-channel MOS transistor forms the output terminal.

3. The level shifter circuit according to claim 2, wherein the first, second N-channel MOS transistors and the first P-channel MOS transistor are configured so as to satisfy the following relationship:

$$L3/W3 \ll L1/W1 \ll L2/W2$$

where L1 and W1 are the channnel length and channel width of the first N-channel MOS transistor, L2 and W2 are the channel length and channel width of the second N-channel MOS transistor and L3 and W3 are the channel length and channel width of the first P-channel MOS transistor.

* * * * *